United States Patent
Litovchenko et al.

(10) Patent No.: US 9,435,862 B2
(45) Date of Patent: Sep. 6, 2016

(54) INTEGRATED CIRCUIT DEVICE AND METHOD THEREFOR

(71) Applicants: Vladimir Litovchenko, Ebersberg (DE); Heiko Ahrens, Munich (DE); Andreas Roland Stahl, Munich (DE)

(72) Inventors: Vladimir Litovchenko, Ebersberg (DE); Heiko Ahrens, Munich (DE); Andreas Roland Stahl, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 177 days.

(21) Appl. No.: 14/330,544

(22) Filed: Jul. 14, 2014

(65) Prior Publication Data
US 2016/0011259 A1    Jan. 14, 2016

(51) Int. Cl.
G01R 31/28    (2006.01)
G01R 31/3187    (2006.01)
G01R 31/317    (2006.01)

(52) U.S. Cl.
CPC ..... *G01R 31/3187* (2013.01); *G01R 31/31721* (2013.01); *G01R 31/31727* (2013.01)

(58) Field of Classification Search
CPC ................... G01R 31/31725; G01R 31/3177; G01R 31/31721; G01R 31/31727; G01R 31/3187
USPC ........................................................ 714/733
See application file for complete search history.

(56) References Cited

U.S. PATENT DOCUMENTS

| | | | |
|---|---|---|---|
| 5,982,189 A * | 11/1999 | Motika | G01R 31/30 324/750.03 |
| 6,901,546 B2 | 5/2005 | Chu et al. | |
| 7,266,745 B2 | 9/2007 | Kiryu | |
| 7,308,634 B2 | 12/2007 | Kiryu | |
| 7,350,124 B2 | 3/2008 | Gloekler et al. | |
| 7,519,889 B1 | 4/2009 | Cervantes et al. | |
| 7,532,003 B1 * | 5/2009 | Greenhill | G01R 31/3004 324/764.01 |
| 7,716,546 B2 | 5/2010 | Le et al. | |
| 7,793,184 B2 | 9/2010 | Douskey | |
| 7,840,015 B1 * | 11/2010 | Melanson | H03F 1/52 330/10 |
| 8,627,133 B2 | 1/2014 | Tsirkin et al. | |
| 2006/0291548 A1 * | 12/2006 | Mattes | G01R 31/31709 375/226 |
| 2008/0077818 A1 * | 3/2008 | Rauschmayer | G06F 1/04 713/400 |
| 2012/0013356 A1 * | 1/2012 | Eckert | G01R 31/31721 324/750.3 |

OTHER PUBLICATIONS

Shanmugasundaram, P. et al., "Dynamic Scan Clock Control in BIST Circuits," IEEE 43rd Southeastern Symposium on System Theory (SSST); Mar. 14-16, 2011; pp. 237-242.

* cited by examiner

*Primary Examiner* — David Ton

(57) ABSTRACT

An integrated circuit device comprising at least one self-test component arranged to execute self-testing within at least one self-test structure during a self-test execution phase of the IC device, and at least one clock control component arranged to provide at least one clock signal to the at least one self-test component at least during the self-test execution phase of the IC device. The at least one clock control component is further arranged to receive at least one indication of at least one power dissipation parameter for at least a part of the IC device, and modulate the at least one clock signal provided to the at least one self-test component based at least partly on the received at least one power dissipation parameter for at least a part of the IC device.

13 Claims, 7 Drawing Sheets

INTEGRATED CIRCUIT DEVICE AND METHOD THEREFOR

FIELD OF THE INVENTION

This invention relates to an integrated circuit device and a method therefor, and in particular to an integrated circuit device and a method therefor of generating at least one clock signal for at least one self-test component within the integrated circuit device.

BACKGROUND OF THE INVENTION

In many integrated circuit (IC) applications, and in particular in safety critical applications, self-testing is an essential component of an IC device, whereby one or more self-tests are executed within at least a part of the IC device. During self-test execution, the application functionality of the part of the device executing the self-test(s) is unavailable for normal (application) operation. However, for safety critical applications the availability of the application functionality is critical. Thus, a key limiting factor for self-test execution is execution time so that the amount of time the application functionality is unavailable during self-test execution is minimized.

Another limiting factor for self-test execution is power consumption, whereby the power consumption of (at least the part of) the device executing the self-test(s) must remain within a predefined power budget during self-test execution. In order to remain within a predefined power budget during self-test execution, the (or each) clock signal for the part of the device under test may need to be configured to comprise a slower clock speed to reduce the power consumption thereof. However, reducing the speed of the clock signal(s) in this manner during self-test execution will increase the self-test execution time, and thus the amount of time the application functionality is unavailable.

Conventionally, structural self-testing is executed at a fixed clock frequency. Such a fixed frequency clocking scheme provides a safe way to remain within a predefined power budget at worst-case conditions. However, a too conservative scheme can result is an unnecessarily long self-test execution time and therefore reduced availability.

SUMMARY OF THE INVENTION

The present invention provides an integrated circuit device and a method of generating at least one clock signal for at least one self-test component within an integrated circuit device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
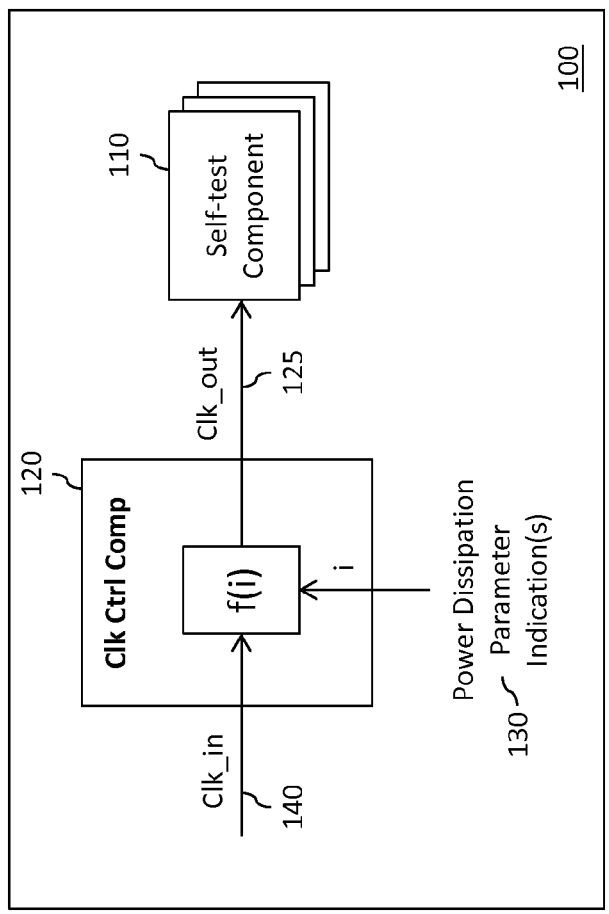
FIG. 1 illustrates a simplified block diagram of an example of an integrated circuit (IC) device.

The present invention will now be described with reference to the accompanying drawings. However, it will be appreciated that the present invention is not limited to the specific examples herein described and as illustrated in the accompanying drawings. For example, in the illustrated examples herein described, a clock control component has been illustrated and described as comprising a separate logical entity to self-test components. However, it is contemplated that such a clock control component may be implemented as an integral part of the, or each, self-test functional block.

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

According to some examples of a first aspect of the present invention, there is provided an integrated circuit (IC) device comprising at least one self-test component arranged to execute self-testing within at least one self-test structure during a self-test execution phase of the IC device, and at least one clock control component arranged to provide at least one clock signal to the at least one self-test component at least during the self-test execution phase of the IC device. The at least one clock control component is further arranged to receive at least one indication of at least one power dissipation parameter for at least a part of the IC device, and modulate the at least one clock signal provided to the at least one self-test component based at least partly on the received at least one power dissipation parameter for at least a part of the IC device.

In this manner, environmental and/or operational conditions that affect the power dissipation characteristics of the IC device may be taken into consideration when configuring the clock signal provided to the self-test component(s). By taking such power dissipation characteristics into account when configuring the clock signal provided to the self-test component(s), the clock speed used for executing self-tests is not limited to a fixed clock frequency that is restrained to a predefined power budget at worst-case conditions. As such, a more optimal clock speed may be achieved during self-testing, enabling the amount of time required to perform self-tests to be reduced, and thus reducing the amount of time application functionality is unavailable during self-test execution.

In some optional examples of the present invention, the at least one indication of at least one power dissipation parameter may comprise at least one static power dissipation parameter value.

In some optional examples of the present invention, the at least one static power dissipation parameter value may be configured within at least one register accessible by the at least one clock control component.

In some optional examples of the present invention, the at least one register may be configurable by at least one external device operably coupled to the IC device to enable the at least one external device to load the at least one static power dissipation parameter value into the at least one register.

In some optional examples of the present invention, the IC device may further comprise at least one memory element comprising non-volatile memory within which the at least one static power dissipation parameter value is arranged to be pre-configured and from which the at least one static power dissipation parameter value is arranged to be loaded into the at least one register.

In some optional examples of the present invention, the at least one indication of at least one power dissipation parameter may comprise at least one dynamic power dissipation parameter value.

In some optional examples of the present invention, the at least one dynamic power dissipation parameter value may comprise at least one from a group comprising at least one of:
   at least one sensor measurement indication; and
   at least one IC device activity indication.

In some optional examples of the present invention, the at least one clock control component may comprise at least one mapping component arranged to perform mapping of the at least one received dynamic power dissipation parameter value to derive at least one clock configuration parameter, and the at least one clock control component may be arranged to modulate the at least one clock signal provided to the at least one self-test component based at least partly on the derived at least one clock configuration parameter.

In some optional examples of the present invention, the at least one mapping component may comprise at least one mapping circuit arranged to perform at least a part of the mapping of the at least one received dynamic power dissipation parameter value to derive at least one clock configuration parameter.

In some optional examples of the present invention, the at least one clock control component may be arranged to perform at least a part of the mapping of the at least one received sensor measurement indication based at least partly on a lookup table stored within an area of memory of the IC device.

In some optional examples of the present invention, the at least one indication of at least one power dissipation parameter for at least a part of the IC device may comprise at least one from a group comprising at least one of:
   at least one static power dissipation parameter value derived from at least one of:
      at least one process characteristic of the IC device;
      at least one package characteristic of the IC device; and
      at least one temperature range specification characteristic of the IC device; and
   at least one dynamic power dissipation parameter value comprising at least one of:
      at least one temperature measurement;
      at least one current measurement for at least one current within the IC device;
      at least one supply voltage level indication for at least a part of the IC device; and
      at least one activity indication for at least a part of the IC device.

According to some examples of a second aspect of the present invention, there is provided a method of generating at least one clock signal for at least one self-test component within an integrated circuit (IC) device. The method comprises receiving at least one indication of at least one power dissipation parameter for at least a part of the IC device, and modulating at least one clock signal to generate the at least one clock signal for the at least one self-test component based at least partly on the received at least one power dissipation parameter for at least a part of the IC device.

Referring now to FIG. 1, there is illustrated a simplified block diagram of an example of an integrated circuit (IC) device 100. In some examples, the IC device 100 may comprise, say, a microcontroller unit (MCU), a microprocessor unit (MPU), a system-on-chip (SoC), a digital signal processor (DSP) device, or any alternative form of IC devices requiring built-in self-test functionality. Self-testing within an IC device is typically implemented using one or more forms of built-in self-test (BIST) mechanism(s). A Logic built-in self-test (or LBIST) is one form of BIST mechanism in which hardware is provided within an IC device allowing the IC device to test its own operation, as opposed to reliance on external automated test equipment. Typically an LBIST is driven by an LBIST-controller running with a clearly defined operating frequency. Other forms of BIST include, by way of example only, MBIST (a BIST optimized for testing internal memory) and software based BIST. Typically an MBIST is driven by an MBIST-controller running with a clearly defined operating frequency. For software based BIST, software is executed by processors which run at a clearly identifiable operating frequency.

The IC device 100 comprises one or more self-test components 110. The self-test components 110 may comprise any appropriate form of BIST component. For example, the self-test component(s) 110 may comprise one or more LBIST component(s) arranged to execute LBIST self-test patterns within one or more respective LBIST structure(s) of the IC device 100. Additionally/alternatively, the self-test component(s) 110 may comprise one or more MBIST component(s) arranged to execute internal memory self-tests and/or one or more software based BIST component(s).

The IC device 100 further comprises a clock control component 120 arranged to provide a clock signal 125 to the self-test component(s) 110 at least during a self-test execution phase of the IC device 100. In the context of the present invention, a self-test execution phase comprises (at least) a phase of operation of at least a part of the IC device 100 wherein at least one self-test component 110 is actively executing at least one self-test.

In the example illustrated in FIG. 1, the clock control component 120 is arranged to receive at least one indication 130 of at least one power dissipation parameter for at least a part of the IC device, and to modulate the clock signal 125 provided to the self-test component(s) 110 at least during self-test execution based at least partly on the received indication(s) 130 of the power dissipation parameter(s). For example, and as illustrated in FIG. 1, the clock control component 120 may be arranged to receive a seed clock signal 140 and to apply modulation (e.g. multiplication and/or division) to the seed clock signal in accordance with the received indication(s) 130 of the power dissipation parameter(s) to generate the clock signal 125 provided to the self-test component(s) 110.

In this manner, environmental and/or operational conditions that affect the power dissipation characteristics of the IC device may be taken into consideration when configuring the clock signal 125 provided to the self-test component(s) 110. Such environmental conditions may comprise, by way of example only, ambient temperature, the type of package within which the IC device 100 is mounted, supply voltage levels, etc. As will be appreciated, the higher the ambient temperature the more difficult it is for heat (and thus power) to be dissipated by the IC device. Furthermore, different types of IC package have different thermal characteristics, and thus have different heat/power dissipation capabilities. Furthermore, higher supply voltage levels typical result in increased heat generation within an IC device. Such operational conditions may comprise, by way of example only, application clock configuration, current consumption, die temperature, temperature limit specifications, etc. As will be appreciated, higher application clock configurations typically result in increased heat generation within an IC device. Furthermore, high current consumption within the IC device typically results in increased heat generation within the IC device. Furthermore, die temperature and temperature limit specifications have a direct impact on the available thermal power budget available within the IC device, for example for executing self-tests and the like. Other power dissipation characteristics that may be taken into consideration may comprise, by way of example, a process corner for the individual IC device, etc.

By taking such power dissipation characteristics into account when configuring the clock signal 125 provided to the self-test component(s) 110, the clock speed used for executing self-tests is not limited to a fixed clock frequency that is restrained to a predefined power budget at worst-case conditions. As such, a more optimal clock speed may be achieved during self-testing, enabling the amount of time required to perform self-tests to be reduced, and thus reducing the amount of time application functionality is unavailable during self-test execution. As such, the present invention enables self-test efficiency within an IC device to be increased, thereby reducing the impact on device operation at runtime.

Figure 2:
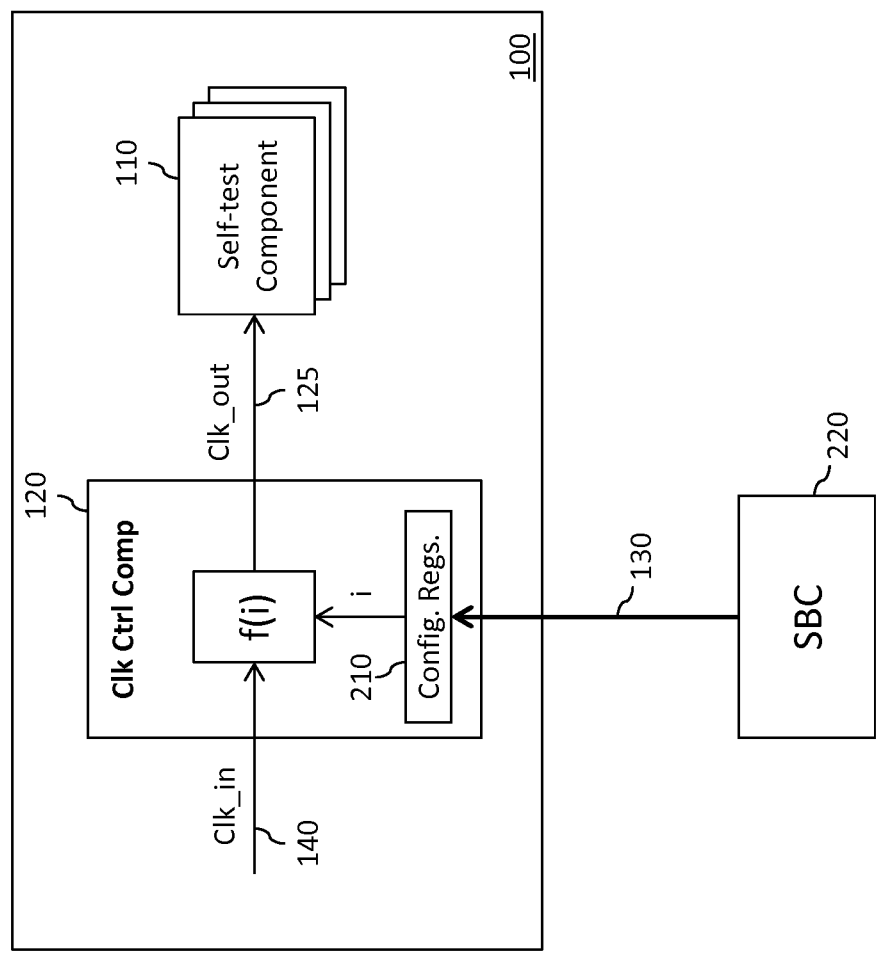
FIG. 2 illustrates a simplified block diagram of an example of one implementation of a clock control component of the IC device of FIG. 1.

Referring now to FIG. 2, there is illustrated a simplified block diagram of an example of one implementation of the clock control component 120 of the IC device 100 of FIG. 1. In the example illustrated in FIG. 2, the clock control component 120 is arranged to receive one or more one indications of at least one power dissipation parameter 130 comprising one or more static power dissipation parameter value. In the example illustrated in FIG. 2, the static power dissipation parameter value(s) is/are configured within a register 210 accessible by the clock control component 120. The register 210 has been illustrated in FIG. 2 as being implemented within the clock control component 120 for ease of understanding. However, it will be appreciated that the register 210 may equally be implemented discrete from the clock control component 120, but accessible thereby. In the example illustrated in FIG. 2, the register 210 is configurable by one or more external devices, such as the system basis chip (SBC) 220 illustrated in FIG. 2, to enable the static power dissipation parameter value(s) 130 to be loaded into the register 210 by, in the illustrated example, SBC 220. For example, the SBC 220 may be arranged to load one or more predefined static power dissipation parameter value(s) 130 into the register 210 upon power up of the IC device 100.

Figure 3:
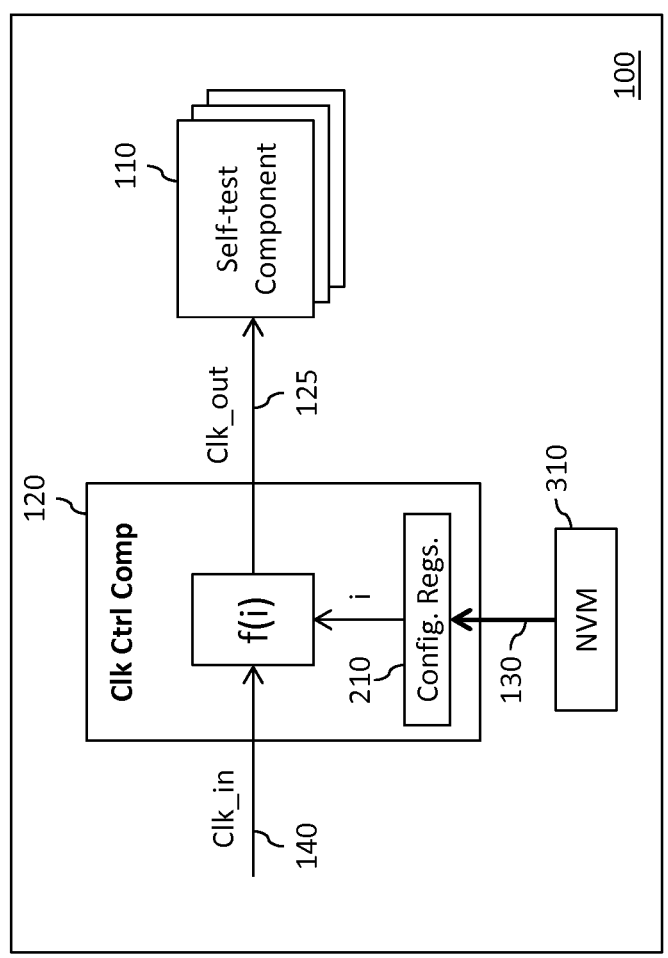
FIG. 3 illustrates a simplified block diagram of an alternative example of one implementation of a clock control component of the IC device of FIG. 1.

Referring now to FIG. 3, there is illustrated a simplified block diagram of an alternative example of one implementation of the clock control component 120 of the IC device 100 of FIG. 1. In the example illustrated in FIG. 3, the clock control component 120 is again arranged to receive one or more one indications of at least one power dissipation parameter 130 comprising one or more static power dissipation parameter value. In the example illustrated in FIG. 3, the static power dissipation parameter value(s) is/are also configured within a register 210 accessible by the clock control component 120. The register 210 has been illustrated in FIG. 3 as being implemented within the clock control component 120 for ease of understanding. However, it will be appreciated that the register 210 may equally be implemented discrete from the clock control component 120, but accessible thereby. In the example illustrated in FIG. 3, static power dissipation parameter value(s) is/are pre-configured within one or more regions of at least one memory element 310 of the IC device 100 comprising non-volatile memory, and is/are arranged to be loaded from the non-volatile memory 310 to the register 210, for example upon power up of the IC device 100.

The static power dissipation parameter value(s) loaded into the register 210 in the examples illustrated in FIGS. 2 and 3 may be derived from, for example, one or more process corner characteristic(s) of the IC device 100, one or more package characteristic(s) of the IC device 100, one or more temperature range specification characteristic(s) of the IC device 100, etc. It will be appreciated that the, or each, static power dissipation parameter value(s) stored within the register 210 may comprise a single bit value or multiple bit values.

Figure 4:
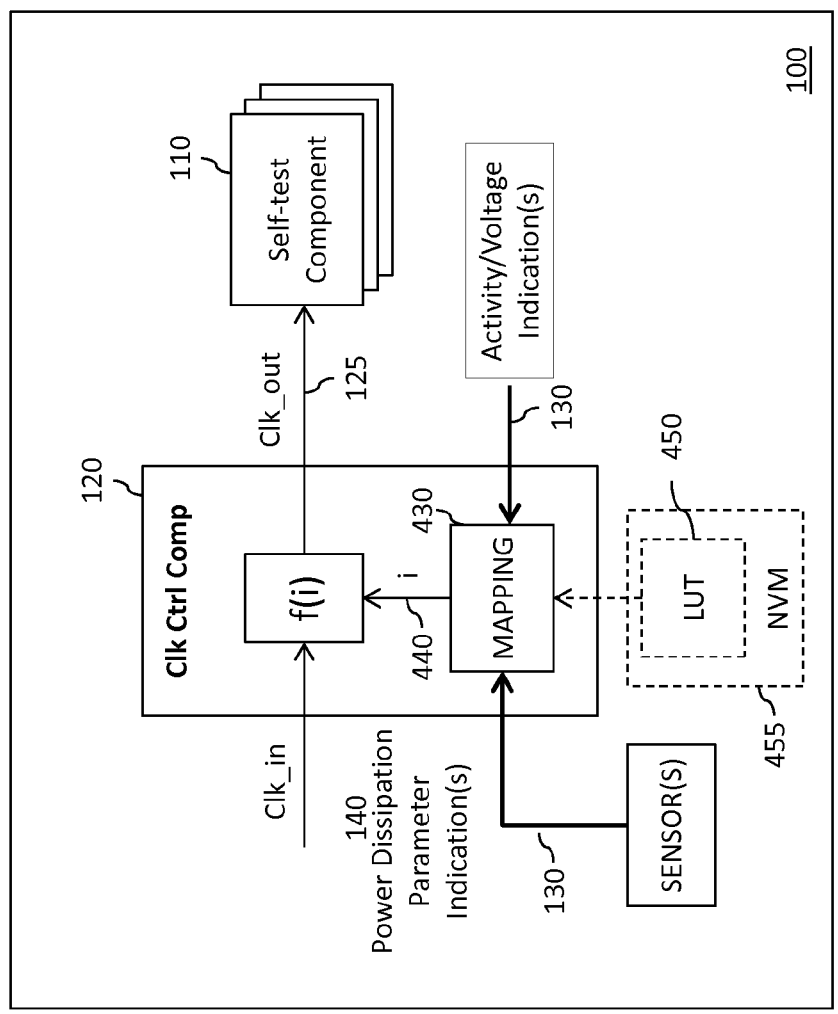
FIG. 4 illustrates a simplified block diagram of a further alternative example of one implementation of a clock control component of the IC device of FIG. 1.

Referring now to FIG. 4, there is illustrated a simplified block diagram of a further alternative example of one implementation of the clock control component 120 of the IC device 100 of FIG. 1. In the example illustrated in FIG. 4, the clock control component 120 is again arranged to receive one or more one indications of at least one power dissipation parameter 130. However, in the example illustrated in FIG. 4, the power dissipation parameter indication (s) 130 comprise(s) one or more dynamic power dissipation parameter value(s). For example, and as illustrated in FIG. 4, such dynamic power dissipation parameter values may comprise, say, one or more sensor measurement indications received from one or more sensor component(s) 410. In the illustrated example the sensor component(s) 410 have been illustrated as being located within the IC device 100. However, it is contemplated that such sensor components may additionally/alternatively be located external to the IC device 100. Such sensor measurement indications may comprise, for example, ambient and/or die temperature measurement indications, current measurement indications, etc. Additionally/alternatively, such dynamic power dissipation parameter values 130 may comprise, say, one or more device activity indications. Such device activity indications may comprise, for example, supply voltage level indications for one or more parts of the IC device 100, one or more activity (e.g. toggling) indications for one or more parts of the IC device 100, etc.

In the example illustrated in FIG. 4, the clock control component 120 comprises a mapping component 430 arranged to perform mapping of the received dynamic power dissipation parameter value(s) 130 to derive one or more clock modulation parameter(s) 440, and the clock control component 120 is arranged to modulate the clock signal 125 provided to the self-test component(s) 110 based at least partly on the derived clock configuration parameter(s) 440. In some examples, the mapping component 430 may comprise one or more mapping circuits arranged to perform (at least a part of) the mapping of the received dynamic power dissipation parameter value(s) 130 to derive the clock configuration parameter(s) 440. In this manner, the mapping component 430 may perform a fixed (hardwired) mapping from the received dynamic power dissipation parameter value(s) 130 to the clock configuration parameter(s) 440. In some further examples, the mapping component 430 may additionally/alternatively be arranged to perform (at least a part of) the mapping of the received dynamic power dissipation parameter value(s) 130 to the clock configuration parameter(s) 440 based at least partly on a lookup table 450 stored within an area of non-volatile memory 455 of the IC device 100. It will be appreciated that the, or each, clock configuration parameter(s) 440 may comprise a single bit value or multiple bit values.

Figure 5:
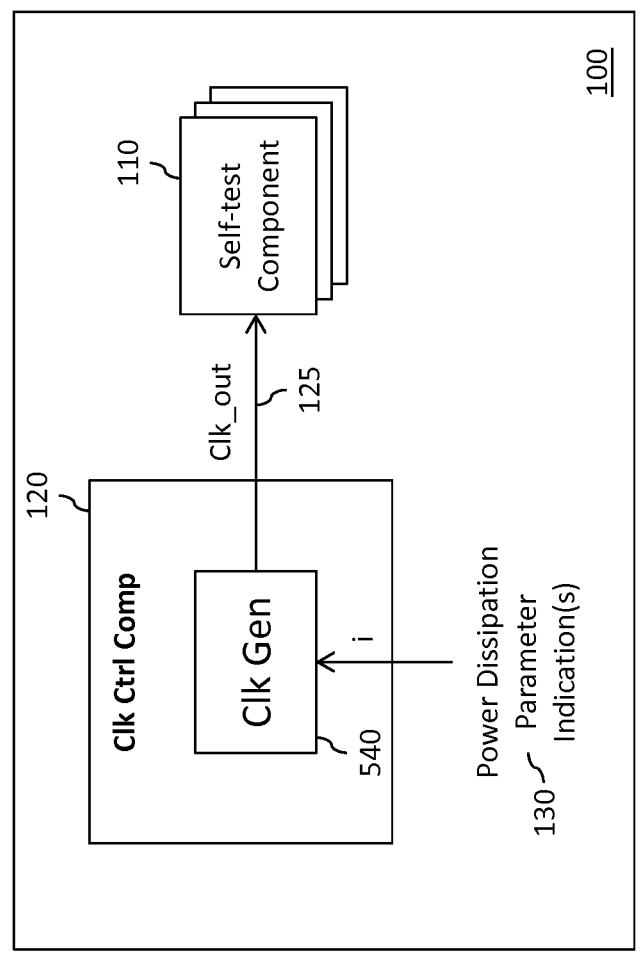
FIG. 5 illustrates a simplified block diagram of the IC device of FIG. 1 comprising an alternative example of the clock control component.

In the examples illustrated in FIGS. 1 to 4 and described above, the clock control component 120 is arranged to receive a seed clock signal 140 and to apply modulation (e.g. multiplication and/or division) to the seed clock signal in accordance with the received indication(s) 130 of the power dissipation parameter(s) to generate the clock signal 125 provided to the self-test component(s) 110. FIG. 5 illustrates a simplified block diagram of an example of an IC device 100 comprising an alternative example of a clock control component 120. In the example illustrated in FIG. 5, the clock control component 120 is arranged to modulate the clock signal 125 provided to the self-test component(s) 110 by way of configuring a source of the clock signal 125 directly, for example by controlling a clock generator 540 therefor. Thus, In the example illustrated in FIG. 5, the clock control component 120 is arranged to receive at least one indication 130 of at least one power dissipation parameter for at least a part of the IC device, and to modulate the clock signal 125 provided to the self-test component(s) 110 at least during self-test execution based at least partly on the received indication(s) 130 of the power dissipation parameter(s) by way of configuring the clock generator 540.

Figure 6:
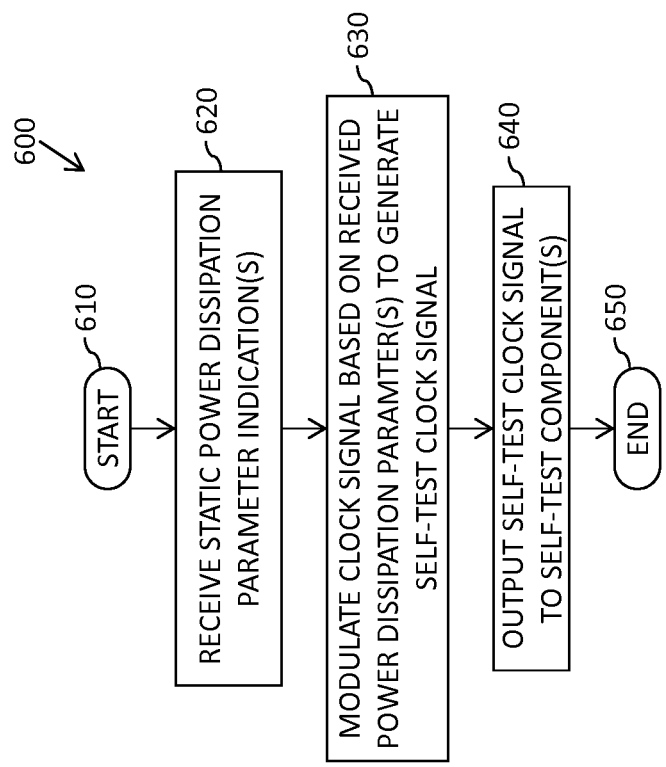
FIG. 6 illustrates a simplified flowchart of an example of a method of generating a clock signal for one or more self-test components within an integrated circuit device.

Referring now to FIG. 6 there is illustrated a simplified flowchart 600 of an example of a method of generating a clock signal for one or more self-test components within an integrated circuit device, such as may be implemented within the IC device 100 of FIGS. 1 to 4. The method starts at 610, and moves on to 620 where one or more power dissipation parameter indications is/are received. In the example illustrated in FIG. 6, the indication(s) of the power dissipation parameter(s) comprise(s) one or more static power dissipation parameter value(s). Such static power dissipation parameter values may be derived from, for example, one or more process corner characteristic(s), one or more package characteristic(s), one or more temperature range specification characteristic(s), etc. Next, at 630, the clock signal provided to the self-test component(s) is then modulated based at least partly on the received static power dissipation parameter value(s). For example, a seed clock may be modulated to generate the self-test clock signal to be provided to the one or more self-test components within the IC device, such as the seed clock signal 140 illustrated in FIGS. 1 to 4. Alternatively, a clock source for the self-test clock signal may be configured directly to generate the self-test clock signal, such as the clock generator 540 illustrated in FIG. 5. The generated self-test clock signal is then output to the one or more self-test components 640, and the method ends at 650.

Figure 7:
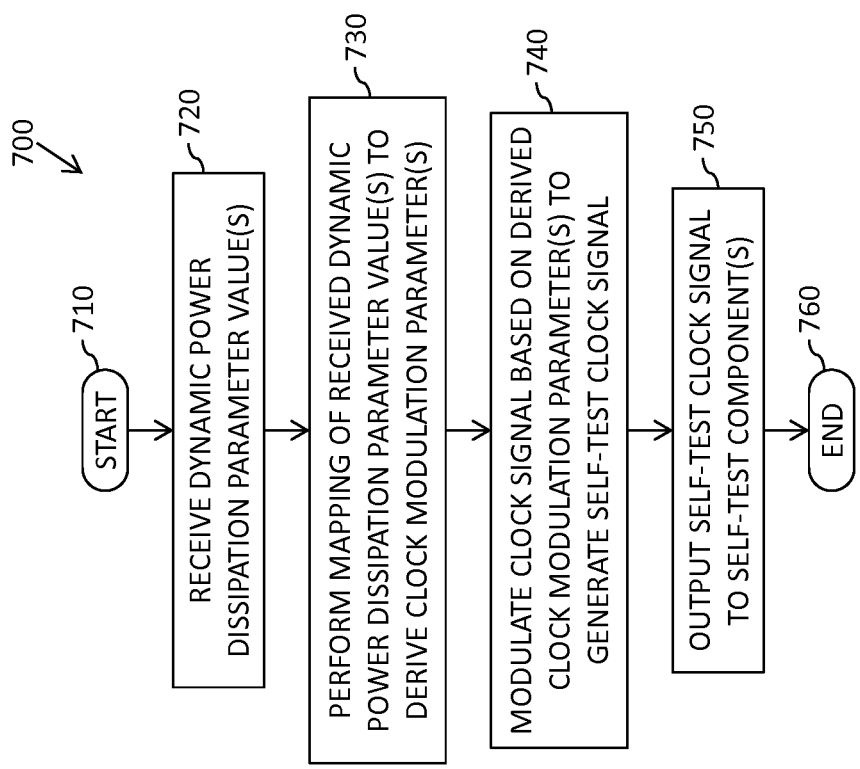
FIG. 7 illustrates a simplified flowchart of an alternative example of a method of generating a clock signal for one or more self-test components within an integrated circuit device

Referring now to FIG. 7 there is illustrated a simplified flowchart 700 of an alternative example of a method of generating a clock signal for one or more self-test components within an integrated circuit device, such as may be implemented within the IC device 100 of FIGS. 1 to 4. The method starts at 710, and moves on to 720 where one or more power dissipation parameter indications is/are received. In the example illustrated in FIG. 7, the indication(s) of the power dissipation parameter(s) comprise(s) one or more dynamic power dissipation parameter value(s). Such dynamic power dissipation parameter values may comprise, say, one or more sensor measurement indications received from one or more sensor component(s). Additionally/alternatively, such dynamic power dissipation parameter values may comprise, say, one or more device activity indications. Next, at 730, the received dynamic power dissipation parameter value(s) is/are then mapped to one or more clock configuration parameter(s). The clock signal provided to the self-test component(s) is then modulated, at 740, based at least partly on the power dissipation parameter value(s). For example, a seed clock may be modulated to generate the self-test clock signal to be provided to the one or more self-test components within the IC device, such as the seed clock signal 140 illustrated in FIGS. 1 to 4. Alternatively, a clock source for the self-test clock signal may be configured directly to generate the self-test clock signal, such as the clock generator 540 illustrated in FIG. 5. The generated self-test clock signal is then output to the one or more self-test components 750, and the method ends at 760.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit, IC, device comprising at least one self-test component arranged to execute self-testing within at least one self-test structure during a self-test execution phase of the IC device, and at least one clock control component arranged to provide at least one clock signal to the at least one self-test component at least during the self-test execution phase of the IC device; wherein the at least one clock control component is further arranged to:

receive at least one indication of at least one power dissipation parameter for at least a part of the IC device; and modulate the at least one clock signal provided to the at least one self-test component based at least partly on the received at least one power dissipation parameter for at least a part of the IC device, wherein the at least one indication of at least one power dissipation parameter comprises at least one static power dissipation parameter value, and the at least one static power dissipation parameter value is/are configured within at least one register accessible by the at least one clock control component.

2. The IC device of claim 1, wherein the at least one register is configurable by at least one external device operably coupled to the IC device to enable the at least one external device to load the at least one static power dissipation parameter value into the at least one register.

3. The IC device of claim 2, wherein the IC device further comprises at least one memory element comprising non-volatile memory within which the at least one static power dissipation parameter value is arranged to be pre-configured and from which the at least one static power dissipation parameter value is arranged to be loaded into the at least one register.

4. The IC device of claim 1, wherein the IC device further comprises at least one memory element comprising non-volatile memory within which the at least one static power dissipation parameter value is arranged to be pre-configured and from which the at least one static power dissipation parameter value is arranged to be loaded into the at least one register.

5. The IC device of claim 1, wherein the at least one indication of at least one power dissipation parameter comprises at least one dynamic power dissipation parameter value.

6. The IC device of claim 5, wherein the at least one dynamic power dissipation parameter value comprises at least one from a group comprising at least one of:
at least one sensor measurement indication; and
at least one IC device activity indication.

7. The IC device of claim 6, wherein the at least one clock control component comprises at least one mapping component arranged to perform mapping of the at least one received dynamic power dissipation parameter value to derive at least one clock configuration parameter, and the at least one clock control component is arranged to modulate the at least one clock signal provided to the at least one self-test component based at least partly on the derived at least one clock configuration parameter.

8. The IC device of claim 5, wherein the at least one clock control component comprises at least one mapping component arranged to perform mapping of the at least one received dynamic power dissipation parameter value to derive at least one clock configuration parameter, and the at least one clock control component is arranged to modulate the at least one clock signal provided to the at least one self-test component based at least partly on the derived at least one clock configuration parameter.

9. The IC device of claim 8, wherein the at least one mapping component comprises at least one mapping circuit arranged to perform at least a part of the mapping of the at least one received dynamic power dissipation parameter value to derive at least one clock configuration parameter.

10. The IC device of claim 9, wherein the at least one clock control component is arranged to perform at least a part of the mapping of the at least one received sensor measurement indication based at least partly on a lookup table stored within an area of memory of the IC device.

11. The IC device of claim 8, wherein the at least one clock control component is arranged to perform at least a part of the mapping of the at least one received sensor measurement indication based at least partly on a lookup table stored within an area of memory of the IC device.

12. The IC device of claim 1, wherein the at least one indication of at least one power dissipation parameter for at least a part of the IC device comprises at least one from a group comprising at least one of:
- at least one static power dissipation parameter value derived from at least one of:
- at least one process characteristic of the IC device;
- at least one package characteristic of the IC device; and
- at least one temperature range specification characteristic of the IC device; and
- at least one dynamic power dissipation parameter value comprising at least one of:
  - at least one temperature measurement;
  - at least one current measurement for at least one current within the IC device;
  - at least one supply voltage level indication for at least a part of the IC device; and
  - at least one activity indication for at least a part of the IC device.

13. A method of generating at least one clock signal for at least one self-test component within an integrated circuit, IC, device, the method comprising:
- receiving at least one indication of at least one power dissipation parameter for at least a part of the IC device; and
- modulating at least one clock signal to generate the at least one clock signal for the at least one self-test component based at least partly on the received at least one power dissipation parameter for at least a part of the IC device, wherein the at least one indication of at least one power dissipation parameter comprises at least one static power dissipation parameter value, and the at least one static power dissipation parameter value is/are configured within at least one register accessible by at least one clock control component.

\* \* \* \* \*